US006713774B2

(12) United States Patent
DeSteese et al.

(10) Patent No.: US 6,713,774 B2
(45) Date of Patent: Mar. 30, 2004

(54) STRUCTURE AND METHOD FOR CONTROLLING THE THERMAL EMISSIVITY OF A RADIATING OBJECT

(75) Inventors: John G. DeSteese, Kennewick, WA (US); Zenen I. Antoniak, Richland, WA (US); Michael White, Kennewick, WA (US); Timothy J. Peters, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 387 days.

(21) Appl. No.: 09/728,786

(22) Filed: Nov. 30, 2000

(65) Prior Publication Data

US 2002/0063223 A1 May 30, 2002

(51) Int. Cl.[7] .......... G21R 1/00; F02R 9/64; F28F 13/18; B64G 1/26; H01L 23/36

(52) U.S. Cl. .......... 250/505.1; 250/492.1; 250/493.1; 250/494.1; 250/503.1; 165/133

(58) Field of Search .......... 250/492.1, 493.1, 250/494.1, 503.1, 505.1; 165/133, 169, 904; 60/266, 39.5

(56) References Cited

U.S. PATENT DOCUMENTS 4,890,454 A 1/1990 Schmidt et al. .......... 60/266
4,899,058 A * 2/1990 Zemel .......... 250/492.1
5,932,029 A 8/1999 Stone et al. .......... 136/253

FOREIGN PATENT DOCUMENTS

WO WO 97/29223 8/1997 .......... 5/2

OTHER PUBLICATIONS

Ohnstein, T.R., et al (Tunable IR Filters With Integral Electromagnetic Actuators, Solid State Sensor and Actuator Workshop Proceedings, 1996, pp 196–199, Hilton Head, SC).

* cited by examiner

*Primary Examiner*—John R. Lee
*Assistant Examiner*—David A. Vanore
(74) *Attorney, Agent, or Firm*—James D. Matheson; Stephen R. May

(57) ABSTRACT

A structure and method for changing or controlling the thermal emissivity of the surface of an object in situ, and thus, changing or controlling the radiative heat transfer between the object and its environment in situ, is disclosed. Changing or controlling the degree of blackbody behavior of the object is accomplished by changing or controlling certain physical characteristics of a cavity structure on the surface of the object. The cavity structure, defining a plurality of cavities, may be formed by selectively removing material(s) from the surface, selectively adding a material(s) to the surface, or adding an engineered article(s) to the surface to form a new radiative surface. The physical characteristics of the cavity structure that are changed or controlled include cavity area aspect ratio, cavity longitudinal axis orientation, and combinations thereof. Controlling the cavity area aspect ratio may be by controlling the size of the cavity surface area, the size of the cavity aperture area, or a combination thereof. The cavity structure may contain a gas, liquid, or solid that further enhances radiative heat transfer control and/or improves other properties of the object while in service.

35 Claims, 14 Drawing Sheets

High Emissivity State

Intermediate Emissivity State

Low Emissivity State

High Emissivity State

Low Emissivity State

High Emissivity State

Low Emissivity State

High Emissivity State

Low Emissivity State

High Emissivity State

Low Emissivity State

High Emissivity State

Low Emissivity State

High Emissivity State

Low Emissivity State

High Emissivity State

Low Emissivity State

STRUCTURE AND METHOD FOR CONTROLLING THE THERMAL EMISSIVITY OF A RADIATING OBJECT

STATEMENT REGARDING FEDERALLY SPONSORED RESEARCH OR DEVELOPMENT

This invention was made with Government support under Contract DE-AC0676RLO1830 awarded by the U.S. Department of Energy. The Government has certain rights in the invention.

FIELD OF THE INVENTION

The present invention relates to a structure and method for changing or controlling the thermal emissivity of the surface of a radiating object in situ, and thus, for changing or controlling the radiative heat transfer between the object and its environment in situ. More particularly, changing or controlling the degree of blackbody behavior of the object is accomplished by changing or controlling certain physical characteristics of a structure defining a plurality of cavities on the surface of the object. As described herein, this cavity structure may be integral to the radiating object or added to the surface of the object to form a new radiating surface.

BACKGROUND OF THE INVENTION

Heat transfer between an object and its environment is achieved by up to three main processes: conduction, convection, and radiation. While conduction occurs at solid/solid and solid/fluid interfaces, the principal means of transferring heat into or out of many systems is by a combination of convective media and radiation. Terrestrial system designs typically exploit both convective and radiative heat transfer, however, heat management in many space (i.e., extraterrestrial) systems relies essentially on radiation because of the lack of a convective medium.

Convective heat transfer is provided by the natural or forced flow of a fluid over the surface of an object and can be controlled by changing parameters such as the fluid medium and/or its physical properties, flow rate, and surface roughness. In contrast, radiative heat transfer depends on the degree of blackbody behavior exhibited by the surface and the fourth power of surface temperature. Thermal energy radiated by a surface is expressed by the Stefan-Boltzmann equation:

$$Q_{rad}=A\sigma\epsilon(T_b^4-T_a^4) \quad (1)$$

where $Q_{rad}$=thermal power radiated (W)

A=area of radiating surface ($m^2$)

$\sigma$=the Stefan-Boltzmann Constant ($5.67\times10^{-8}W/m^2/K^4$)

$\epsilon$=thermal emissivity factor of radiating surface $T_b$=temperature of the radiating surface (K)

$T_a$=ambient temperature (K)

The thermal emissivity factor ($\epsilon$) is the ratio of an object's radiative emission efficiency to that of a perfect radiator, also called a blackbody. The thermal emissivity factor of most materials ranges between 0.05 and 0.95 and is relatively constant over a significant temperature range. Therefore, the radiative heat transfer capability of an object is typically a predetermined, monotonic function of its temperature raised to the fourth power.

The following example illustrates the expected impact of changing the thermal emissivity, or degree of blackbody behavior, of an object that is transferring heat by free convection and radiation. In this example, the reference object is a horizontal cylinder 1 m long with a 10 cm outer diameter, rejecting heat to a 300K environment through free convection and radiation. A simplified equation for the laminar flow convective heat transfer coefficient, h, for the object is:

$$h=1.32(\Delta T/D_c)^{0.25} \quad (2)$$

(Holman, J. P., Heat Transfer, Sixth Edition, McGraw-Hill) where $\Delta T$=temperature difference between surface and ambient (K)

$D_c$=diameter of cylinder (m)

Heat transferred by convection ($Q_{conv}$) is expressed by:

$$Q_{conv}=hA(T_b-T_a) \quad (3)$$

where A, $T_b$, and $T_a$ are the same variables as in Equation 1.

FIG. 1 shows the amount of heat rejected from the reference object by convection and radiation using Equations 1 and 3, respectively, over a $\Delta T$ range of 1–1000 K, which covers a principal range of engineering interest. This figure shows the convection term ($Q_{conv}$) to be approximately an order of magnitude larger than radiation ($Q_{rad}$) from a surface with $\epsilon$=0.1 for $\Delta T$ up to about 100 K. Beyond this temperature, the $T^4$ dependence of radiation increases more rapidly, making the two modes of heat transfer approximately equal when $\Delta T$ approaches 1000 K. In contrast, radiation from a surface exhibiting ideal blackbody behavior (i.e., $\epsilon$=1.0) is always greater than convection and is at least an order of magnitude larger when $\Delta T$ is near or above 1000 K. More importantly, FIG. 1 illustrates the potential impact on the heat transfer capability of the reference object as the thermal emissivity of its surface changes, by changing the thermal emissivity factor from $\epsilon$=1.0 to $\epsilon$=0.1, and vice versa.

Thus, the ability to change or control the degree of blackbody behavior of a radiating object, while it is in service (i.e., in situ), analogous to changing or controlling the convective term in a fluid system during operation by altering the flow rate of the fluid, would enable a remarkable improvement in the thermal design and control of many systems where radiative heat transfer is important. For example, the surface of an object or system with controllable thermal emissivity could be activated at some limiting temperature as a thermal safety valve. In this mode of operation, the surface would be triggered to switch to a higher thermal emissivity that, in turn, radiates more heat to prevent the temperature of the object or system increasing above safe limits. Similarly, switching thermal emissivity to a lower value could protect against a system operating at less than a desirable temperature limit.

In addition, changing the thermal emissivity of an object will effectively change its thermal, or infrared (IR), signature. This is especially important in detection, recognition, and camouflage applications. For example, the ability to change or control the thermal emissivity of an object provides an opportunity for an object to match its thermal emission characteristics with those of other objects or structures in its vicinity, thereby enabling an IR camouflage effect.

In current systems where radiative heat transfer is important, the surface material and/or surface preparation of a radiating object is carefully selected to obtain the desired fixed thermal emissivity and resulting radiative heat transfer characteristic. Typical surface preparations include a variety of coating, etching, and polishing techniques. Etching techniques are also being used to create fixed surface textures for spectroscopic applications. For example, Ion Optics Inc. (Waltham, Mass.) has developed tuned infrared sources using ion beam etching processes that create a random fixed surface texture consisting of sub-micron rods and cones (http://www.ion-optics.com). Such a surface texture has a high emissivity over a narrow band of wavelengths and low emissivity in other bands and is an attractive alternative to IR light-emitting diodes.

Applying the emerging field of solid state microelectromechanical technology, tunable IR filters for IR spectral analysis are also being developed. An example of such a device is reported by Ohnstein, T. R., et al ("Tunable IR Filters With Integral Electromagnetic Actuators," Solid State Sensor and Actuator Workshop Proceedings, 1996, pp 196–199, Hilton Head, S.C.). Such tunable IR filters comprise arrays of waveguides whose transmittance can be varied by changing the spacing between them using linear actuators. The wavelength cutoff range from 8 $\mu$m to 32 $\mu$m achieved by Ohnstein et al with this technology is typical of its narrowband selectivity. Such IR spectral analysis devices, like the devices developed by Ion Optics, Inc., are purposely designed with surface microstructures having dimensions comparable to specific wavelengths in the electromagnetic spectrum to be effective at wavelengths that are discrete or in narrow bandwidths. Consequently, these devices are ineffective for applications which require the changing or controlling of broader ranges of wavelengths important in radiative heat transfer.

Accordingly, there is a need for a capability to change or control broadband radiative heat transfer between an object and its environment while the object is in service.

BRIEF SUMMARY OF THE INVENTION

The present invention provides a structure and method for changing or controlling the thermal emissivity of the surface of an object in situ, and thus, changing or controlling the radiative heat transfer between the object and its environment in situ. Changing or controlling the degree of blackbody behavior of the object is accomplished by changing or controlling certain physical characteristics of a cavity structure on the surface of the object. The cavity structure, defining a plurality of cavities, may be formed by selectively removing material(s) from the surface, selectively adding a material(s) to the surface, or adding an engineered article(s) to the surface to form a new radiative surface.

The physical characteristics of the cavity structure that are changed or controlled in accordance with the present invention include cavity area aspect ratio, cavity longitudinal axis orientation, and combinations thereof. Controlling the cavity area aspect ratio may be performed by controlling the size of the cavity surface area, the size of the cavity aperture area, or a combination thereof. As described herein, the cavity structure may contain a gas, liquid, or solid that further enhances radiative heat transfer control and/or improves other properties of the object, for example surface finish, while in service.

The subject matter of the present invention is particularly disclosed and distinctly claimed in the concluding portion of this specification. However, both the organization and method of operation, together with further advantages and objects thereof, may best be understood by reference to the following description and examples taken in connection with accompanying drawings wherein like reference characters refer to like elements.

DETAILED DESCRIPTION OF THE INVENTION

An aspect of the present invention is a structure on the surface of an object wherein the structure defines a geometric or random array of cavities open to the environment, for example pits, thru-holes, closed-end holes, and the like. The structure may be formed by selectively removing material(s) from the surface, selectively adding a material(s) to the surface, or adding an engineered article(s) to the surface to form a new radiative surface. The structure may be similar to closed-cell or open-cell foams in the regard that the cavities may be physically separated from other cavities or may be interconnected with one or more other cavities. The structure may be formed by a suitable mechanical, chemical, electrical, or biological process including but not limited to drilling, pressing, coining, etching, lithography, irradiation, laser ablation, vapor deposition, explosive forming, spallation, bacterial, enzyme and viral action, and combinations thereof. It is to be understood that this list of processes, and others disclosed herein, are exemplary only and that those skilled in this art will appreciate that the present invention is not limited to a particular method of forming a structure defining a plurality of cavities.

A purpose of the following FIGS. 2–5 is to provide a basis for terminology used herein to describe the structure defining a plurality of cavities. FIGS. 6–16 illustrate various embodiments of the present invention whereby the degree of blackbody behavior of an object (i.e., thermal emissivity) can be changed or controlled using such a structure.

Figure 1:
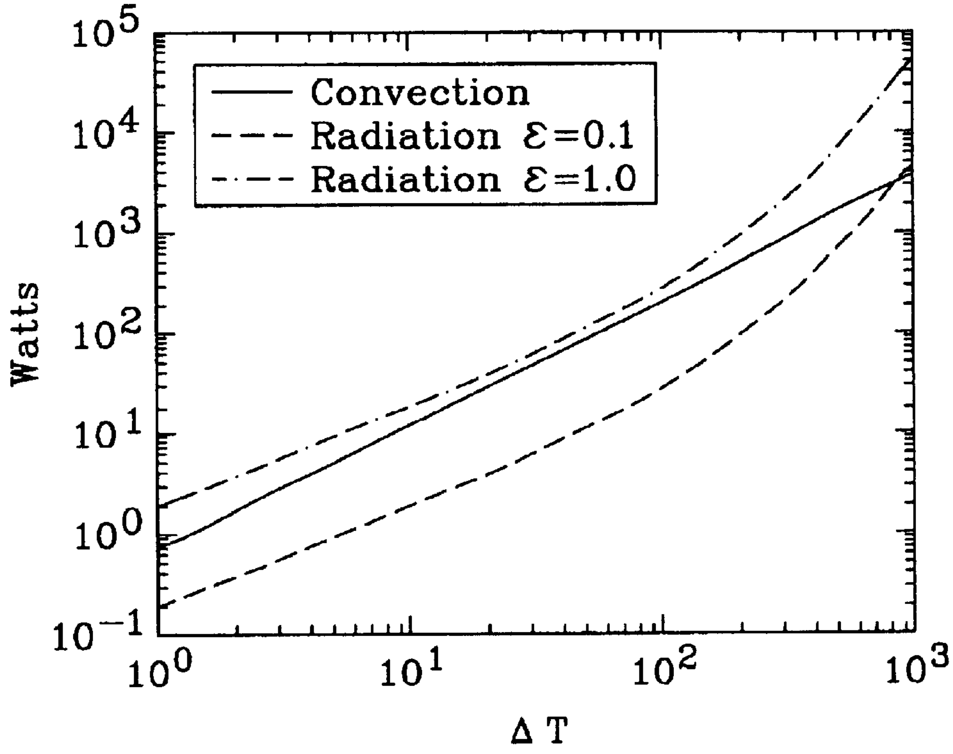
FIG. 1 illustrates the temperature dependence of convective and radiative heat transfer at two extreme values of the thermal emissivity factor at temperatures between 1 and 1000 K.
Figure 2:
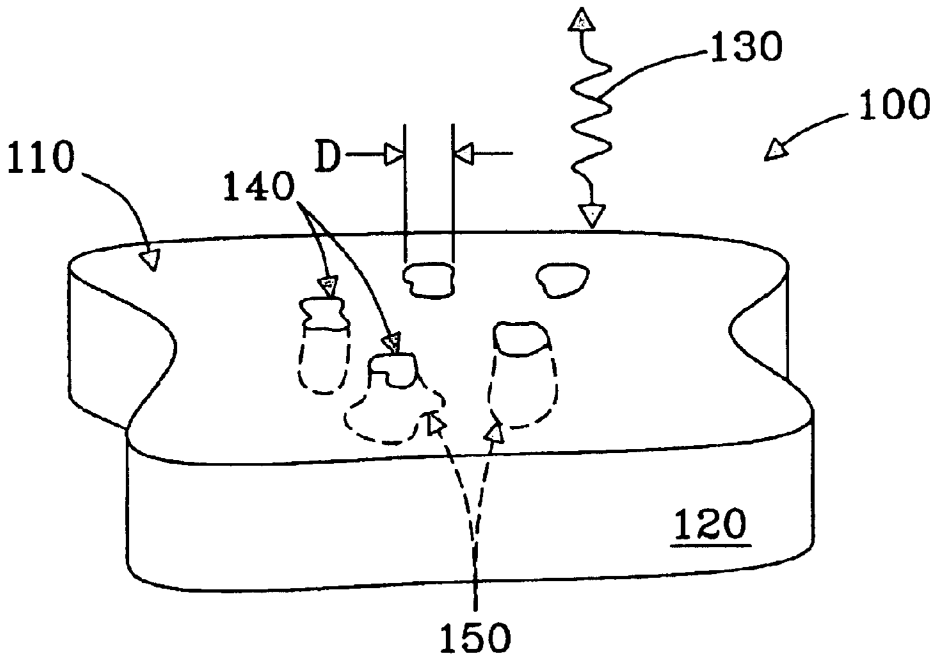
FIG. 2 illustrates a simplified representation of a cavity structure.

FIG. 2 illustrates a simplified representation of a cavity structure 100 comprising a radiative surface 110 of an object 120 wherein the cavity structure 100 defines a plurality of cavities open to the environment with which the object 120 is transferring radiant energy 130. In particular, the cavity structure 100 defines a plurality of cavity apertures 140 at the radiative surface 110, each with a cross-sectional area $A_a$ and an effective diameter D equal to $2\times(A_a/\pi)^{1/2}$, and a plurality of cavity surfaces 150, each with a cavity surface area $A_c$. The cavity area aspect ratio R is defined as $A_c/A_a$. The cavity apertures 140 (and cavity surfaces 150) are not necessarily the same size and shape for a given cavity structure 100. As is known to those skilled in the art, the cavity apertures 140 and cavity surfaces 150 may be any size and shape, including those that define slots, consistent with (1) the theory behind blackbody behavior of cavities (e.g., Chapter 3 of Wolfe, W. L., 1965, Handbook of Military Infrared Technology, Office of Naval Research, Department of the Navy, Washington, D.C.), (2) the desired range of thermal emissivity control of the cavity structure 100, and (3) other desired surface properties of the cavity structure 100, for example surface finish or roughness.

The number and density of cavity apertures 140 and cavity surfaces 150 are variable and depends on the desired degree of blackbody behavior of the cavity structure 100 and desired degree of radiative control. Measurable thermal emissivity changes were obtained with the present invention when the cumulative sum of the cross-section areas of the cavity apertures 140 (i.e., $\Sigma A_a$) was as low as 20% of the object's surface (i.e., the ratio of total cavity aperture area, $\Sigma A_a$, to the area of the radiative surface 110 was 1:4). In most engineered systems, however, it is typically desirable to have a higher percentage of the object's surface occupied by cavity apertures 140 and cavity surfaces 150 so that a larger range of radiative control is obtained.

Figure 3:
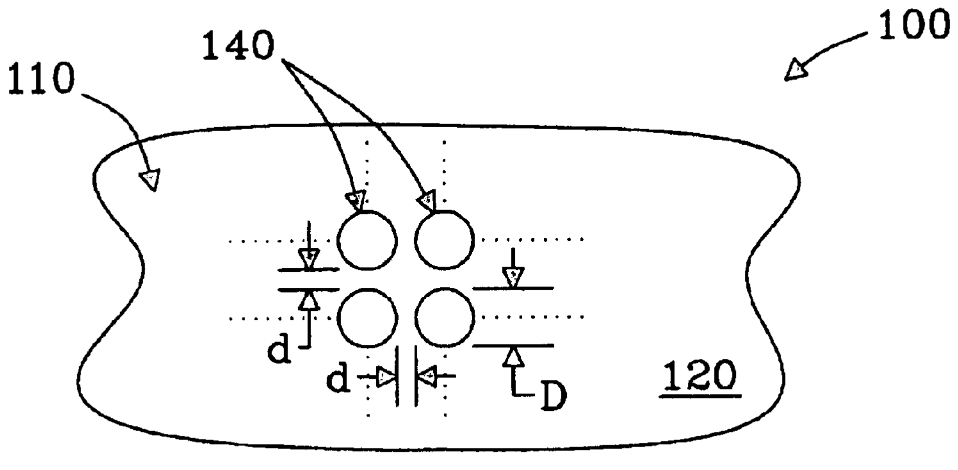
FIG. 3 shows the top view of one example of a cavity structure defining a plurality of cavities and a geometric array of cavity apertures with circular shapes.

FIG. 3 shows the top view of an example of a cavity structure 100, comprising the radiative surface 110 of an object 120, and defining a dense array of cavity apertures 140 with circular shapes (the cavity surfaces 150 below the cavity apertures 140 are not shown for clarity). In this example, the cavity apertures 140 have an effective diameter D (equal to the diameter of the cavity apertures 140) centered on a square pitch array with the thinnest section of wall of the cavity structure 100 between adjacent cavity apertures 140 designated by the minimum wall thickness d. Choosing a minimum wall thickness d equal to about 0.08D provides the following ratio of total cavity aperture area, $\Sigma A_a$, to the area of the radiative surface 110 (i.e., surface area unoccupied by cavity apertures 140 and excluding $\Sigma A_c$):

$$0.25\pi D^2:[(1.08D)^2-0.257\pi D^2]\cong 2:1$$

The cavity structure 100 in FIG. 3 will increase the radiative heat transfer capability of the object 120 (relative to an unaltered object surface) proportional to the sum of the respective $A\epsilon$ terms in Equation 1. In this example, if $\epsilon=0.1$ for the radiative surface 110 (i.e., the object surface unoccupied by cavity apertures) and the cavities represent blackbodies (i.e., $\epsilon=1.0$), the cavity structure 100 enhances the radiative power of the object 120 by a factor of:

$$(2\times1+1\times0.1)/((2+1)\times0.1)=7$$

The ultimate potential enhancement of radiative power by this means can closely approach that of the whole surface of the object 120 acting as a single blackbody. Both larger and smaller radiation enhancement factors will be achieved with different minimum wall thicknesses d and different emissivities of the radiative surface 110. For example, if the cavities represent blackbodies, d=0.08, and $\epsilon=0.05$ for the radiative surface 110, there is the potential of a nearly 15-fold enhancement, whereas having $\epsilon=0.2$ allows only a 3-fold enhancement. As will be described later, such a cavity structure 100 can be physically altered in situ to reduce the degree of blackbody behavior (and then physically altered again in situ to increase the degree of blackbody behavior) so that a range of radiative control is obtained.

The shape of the cavity aperture 140 may be any regular shape (e.g., circular, elliptical, rectangular, quadrilateral, and other polygonal shapes) or any irregular shape, although the shape will typically be limited by manufacturing and economic constraints. Effective diameters of the cavity apertures 140 in the range from about 1 μm to several 1000 μm are practical and provide the principal benefits of the present invention for most engineered systems. Larger effective diameters may be optimal for very large systems. Smaller effective diameters may be optimal for systems operating at very high temperatures. As is evident to those skilled in the art, the range of radiative heat transfer control depends upon the radiation bandwidth emitted by the object 120. Consequently, it is preferred that the size of the cavity apertures 140 be chosen to achieve an acceptable amount of radiative heat transfer control by virtue of the temperature of the object 120. In most applications, it is preferred that the average effective diameter of the plurality of cavity apertures 140 is at least 10 μm.

Figure 4A:
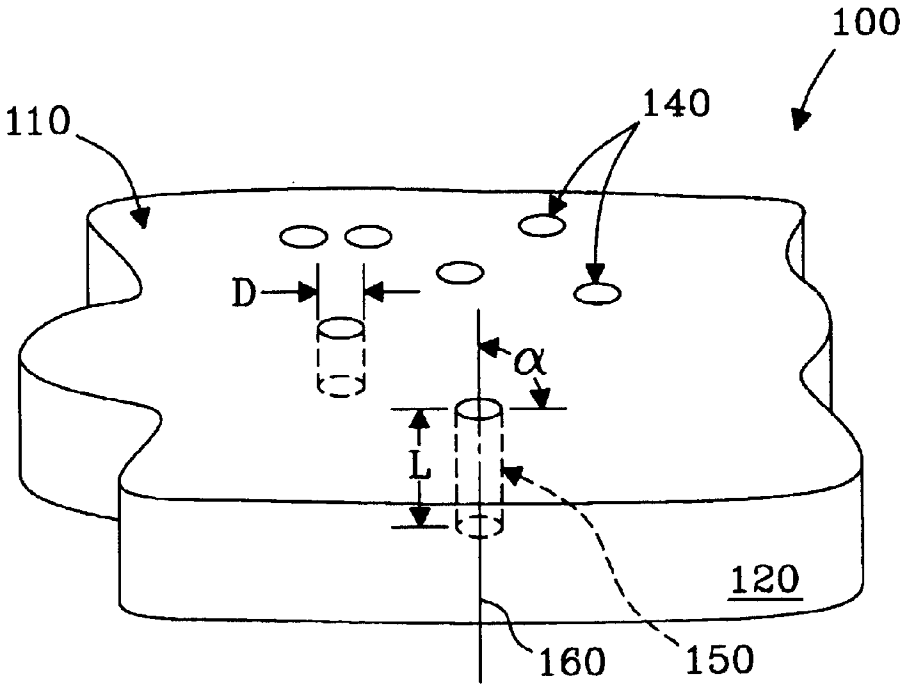
FIG. 4*a* illustrates an example of a cavity structure defining a plurality of cylindrically-shaped cavity surfaces having cavity longitudinal axes oriented relative to the radiative surface.

FIG. 4*a* illustrates an example of a cavity structure 100 defining a plurality of cylindrical cavity surfaces 150 (and circular cavity apertures 140) with an effective diameter of D (equal to the diameter of the cylinder) and a depth/length of L. In this example, the cavity area aspect ratio R equals $A_c/A_a=(\pi DL+\pi D^2/4)/\pi D^2/4=4L/D+1$. When the cavity structure 110 defines closed-end holes made by drilling or boring, the bottom of the cavity surfaces 150 will typically have a shape that conforms to the machine tool used to form the cavities (e.g., a taper produced by a standard drill bit). In cases whereby the shape of the cavity surface 150 has a longitudinal axis (as conventionally defined) the orientation of such a cavity longitudinal axis 160, relative to the radiative surface 110, is measured by the angle α as shown in FIG. 4*a*.

Figure 4B:
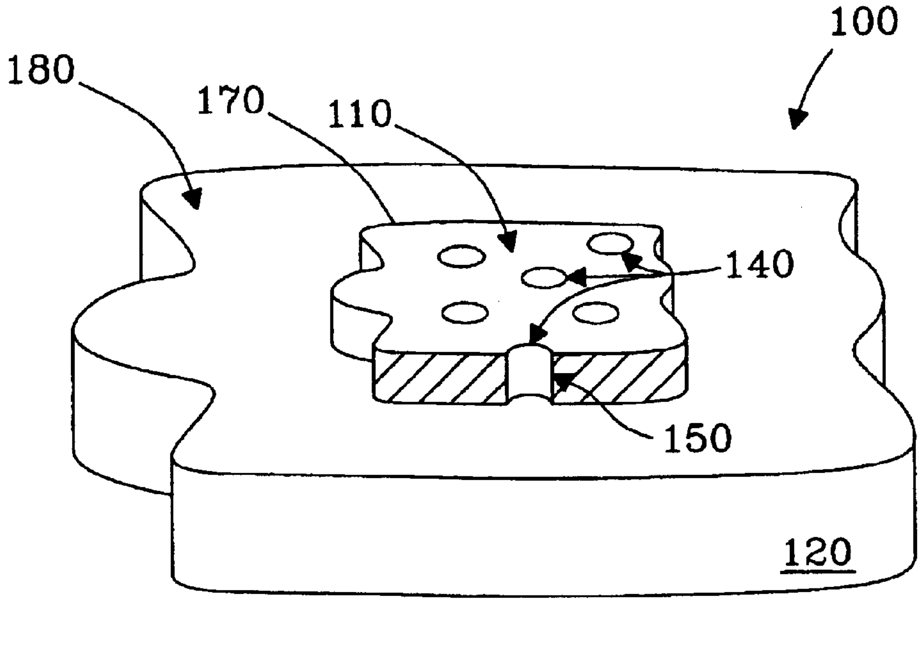
FIG. 4*b* illustrates an alternative mode of obtaining a cavity structure, similar to that of FIG. 4*a*, by the addition of a cavity article on the surface of the object.

FIG. 4*b* illustrates another example of a cavity structure 100, similar to that of FIG. 4*a*, except that the cavity structure 100 in FIG. 4*b* is formed by the addition, or deposition, of a cavity article 170 to the surface 180 of the object 120 to form a new radiative surface 110. As is evident to those skilled in the art, the cavity article 170 would typically be in contact with the object 120 in a manner to assure a good thermal bond. The cavity article 170 may be formed by a variety of material deposition techniques, including those used in semiconductor manufacture, or may comprise a separately manufactured component (e.g., a perforated plate, screen, mesh, fiber mat) that is in contact with the object 120. Furthermore, the cavity structure 100 may be formed by combining the cavity structure 100 shown in FIG. 4*a* with the cavity article 170 shown in FIG. 4*b* such that the cavity surface 150 resides in both the object 120 and the cavity article 170. This may be advantageous from a manufacturing perspective since boring cavities deep enough to act as blackbodies may be difficult in some sizes, materials and/or configurations. Furthermore, such a shared arrangement also provides another mode of thermal emissivity control as explained in more detail below.

Figure 5A:
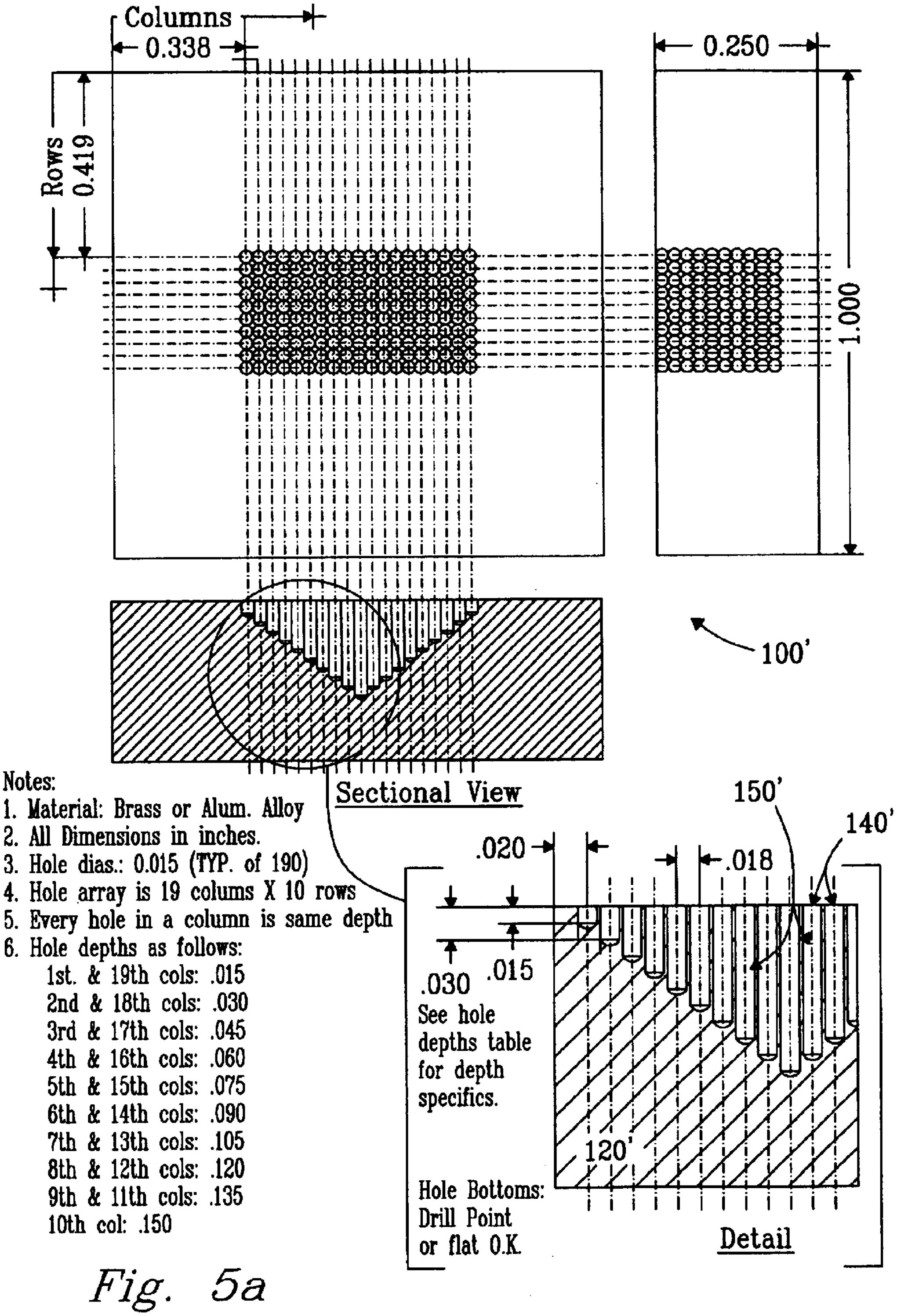
FIG. 5*a* illustrates a test cavity structure used to determine the effect of cavity area aspect ratio on radiative heat transfer from the structure.
Figure 5B:
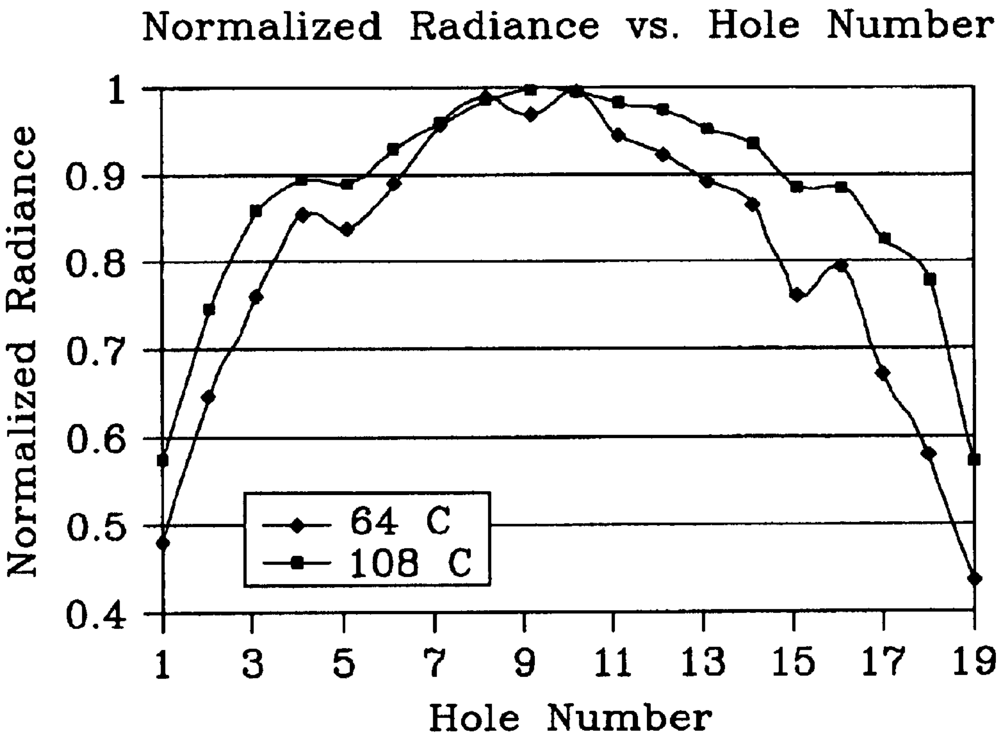
FIG. 5*b* graphically depicts the radiance as a function of hole number (i.e., cavity area aspect ratio) in the test cavity structure of FIG. 5*a* at two operating temperatures.

As is evident from the previous discussion, the amount of radiative control of an object 120 depends upon the amount by which its thermal emissivity can be changed. For maximum radiative control, the thermal emissivity factor should be capable of being changed from a value of near 0 to near 1 and vice versa. In accordance with the present invention, a cavity structure 100 having an average cavity area aspect ratio of approximately 8 or greater provides a means by which the thermal emissivity of an object's surface can be significantly increased. This is illustrated in FIGS. 5*a*–5*b* whereby a test cavity structure 100', defining 190 cavity apertures 140' and cavity surfaces 150', has variable cavity area aspect ratios ranging between 5 and 41 ($1^{st}/19^{th}$ holes and $10^{th}$ hole, respectively). FIG. 5*b* shows the measured normalized radiance of each cavity (i.e., hole) which is proportional to its thermal emissivity. The $1^{st}$ and $19^{th}$ holes, each with a depth to diameter ratio of 1:1 (i.e., a cavity area aspect ratio of 5) have a radiance close to that of the unmodified surface of the test object 120'. The $2^{nd}$ and $18^{th}$ holes, each with a depth to diameter ratio of 2:1 (i.e., a cavity area aspect ratio of 9) show an onset of increased radiance, and hence increased thermal emissivity. Holes with higher depth to diameter ratios show the expected higher radiance. As is evident to those skilled in the art, the aforementioned cavity area aspect ratio range of approximately 8 or greater would also be expected to be suitable for a cavity structure 100 defining a plurality of cavities whereby one or more of the cavities are backfilled with a material that is substantially transparent to incident and emitted radiation. Such backfilling would be advantageous, for example, in applications whereby the object 120 requires a smooth surface finish.

Embodiments Whereby ε is Changed by Changing R

An embodiment of the present invention is a cavity structure 100 for an object 120 whereby the radiative heat transfer between the object 120 and its environment is controlled in situ by controlling the cavity area aspect ratio R of the cavity structure 100 in situ (in some circumstances, changing the cavity area aspect ratio R also changes the ratio of total cavity aperture area to surface area unoccupied by cavity apertures 140). Controlling the cavity area aspect ratio R may be implemented by controlling the effective size of the cavity aperture area $A_a$, the effective size of the cavity surface area $A_c$, or a combination thereof. The controlling may be by passive means, active means, or a combination thereof (e.g., spontaneous or externally applied stimuli such as temperature, chemistry, biology, humidity, pressure, electrical current or field, voltage, magnetic field, electromagnetic radiation, particle radiation, mechanical force, and combinations thereof).

FIGS. 6–13 illustrate specific embodiments of the present invention whereby thermal emissivity control is obtained by varying the cavity area aspect ratio R. In these figures, the control systems and actuators are not shown because it is evident to those skilled in the art that a variety of control systems and actuators could be utilized and interfaced with the cavity structure 100 without undue experimentation.

Figure 6A:
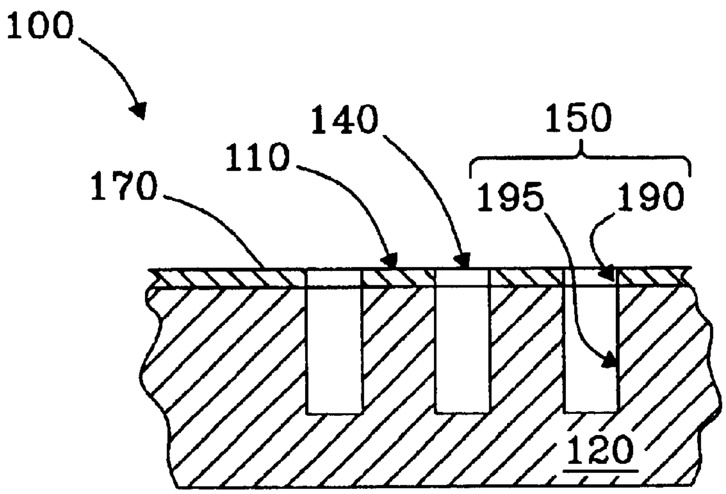
FIGS. 6*a*–6*c* illustrate an embodiment of the present invention whereby the degree of blackbody behavior (i.e., thermal emissivity) of the cavity structure is changed from a high emissivity state (FIG. 6*a*), to an intermediate emissivity state (FIG. 6*b*), and then to a low emissivity state (FIG. 6*c*), by changing the cavity area aspect ratio (i.e., by changing $A_a$) by translational movement of a cavity article relative to the object.
Figure 6B:
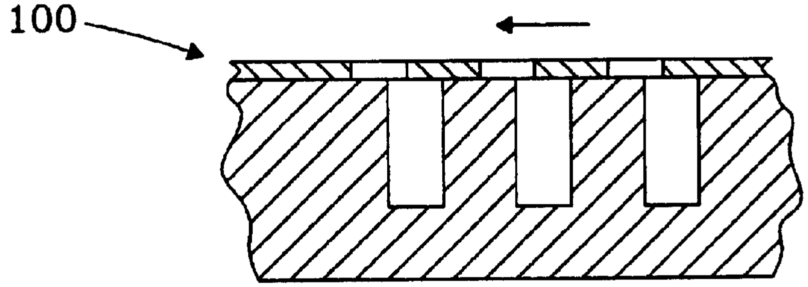
Figure 6C:
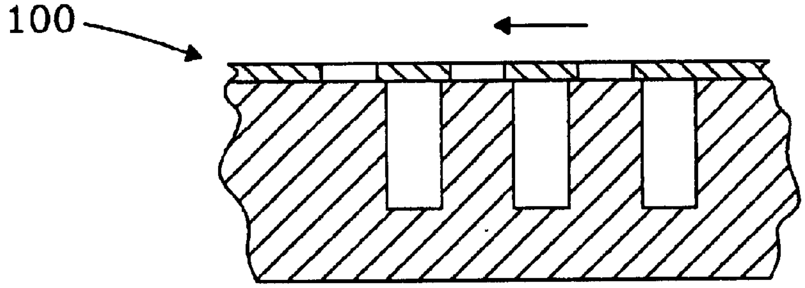

FIGS. 6*a*–6*c* illustrate an embodiment of the present invention comprising a cavity article(s) 170 that is a perforated plate/sheet, sleeve, screen, or mesh. The cavity surface 150 defining the combination of thru-hole surfaces 190 in the cavity article 170 and the hole surfaces 195 in the object 120. The array of perforations in the cavity article 170 dimensionally match the array of holes in object 120 so that when the thru-hole surfaces 190 are aligned in full coincidence with the hole surfaces 195, the thermal emissivity of the resulting cavity is at a maximum (FIG. 6*a*). As the cavity article(s) 170 is translated relative to the object 120, the effective size of the aperture area $A_a$ is changed such that the thermal emissivity of the cavity structure 100 is controlled over a range of different values (FIG. 6*b*). A minimum thermal emissivity is obtained when there is no coincidence between the thru-hole surfaces 190 and hole surfaces 195 (FIG. 6*c*). Relative movement between the cavity article(s) 170 and the object 120 may be by passive means, active means, or a combination thereof including mechanical, thermal, electrical, magnetic, and chemical means (e.g., the cavity article(s) 170 may be moved by a solenoid, motor, bimetallic actuator, piezoelectric element, etc. (not shown) that is connected to a control system (not shown)).

Figure 7A:
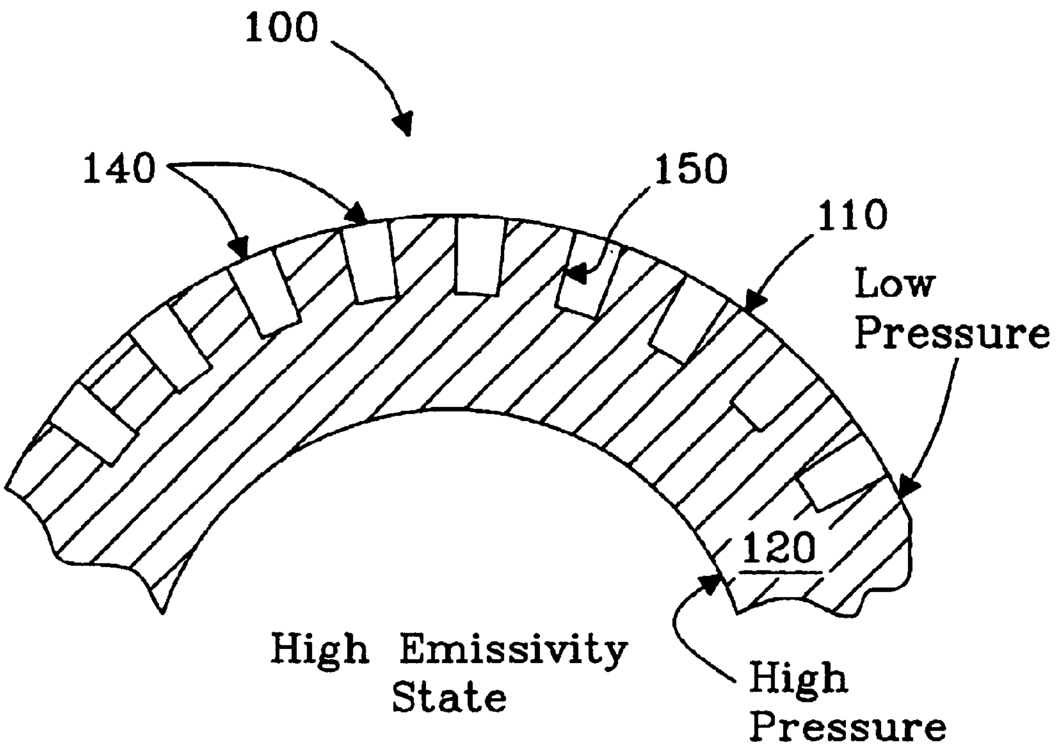
FIGS. 7*a*–7*b* illustrate an embodiment of the present invention whereby the degree of blackbody behavior (i.e., thermal emissivity) of the cavity structure is changed from a high emissivity state (FIG. 7*a*) to a low emissivity state (FIG. 7*b*) by changing the cavity area aspect ratio (i.e., by changing $A_a$) by the application of tensile or compressive forces resulting from pressure differences across the object.
Figure 7B:
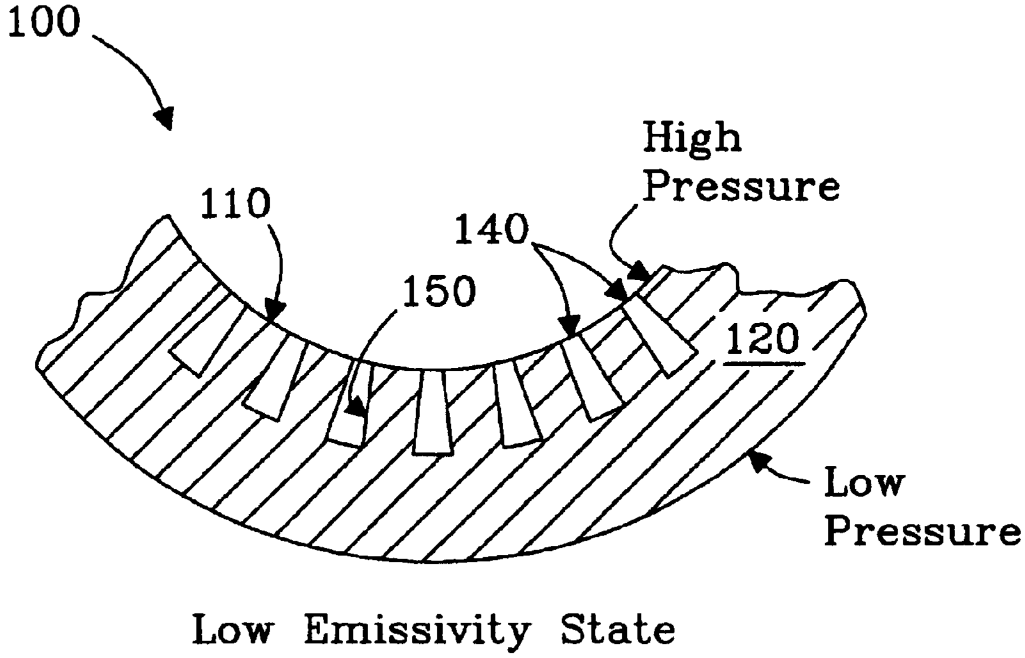

FIGS. 7*a*–7*b* illustrate a further embodiment of the present invention whereby the cavity area aspect ratio is changed (i.e., by changing the area of the cavity aperture 140) by applying tensile or compressive forces to the radiative surface 110 of the object 120 (e.g., by applying a differential pressure across the object 120 as shown FIGS. 7*a*–7*b*). Similar cavity aspect ratio changes can be induced by exposing a cavity structure 100 that is made of a hydrophilic, or hydrophobic, material to water. The present invention anticipates all means of swelling, shrinking, deforming, exposing, or obscuring single or multiple cavity apertures 140 to change the effective aperture area $A_a$, and thus cavity area aspect ratio R.

Figure 8A:
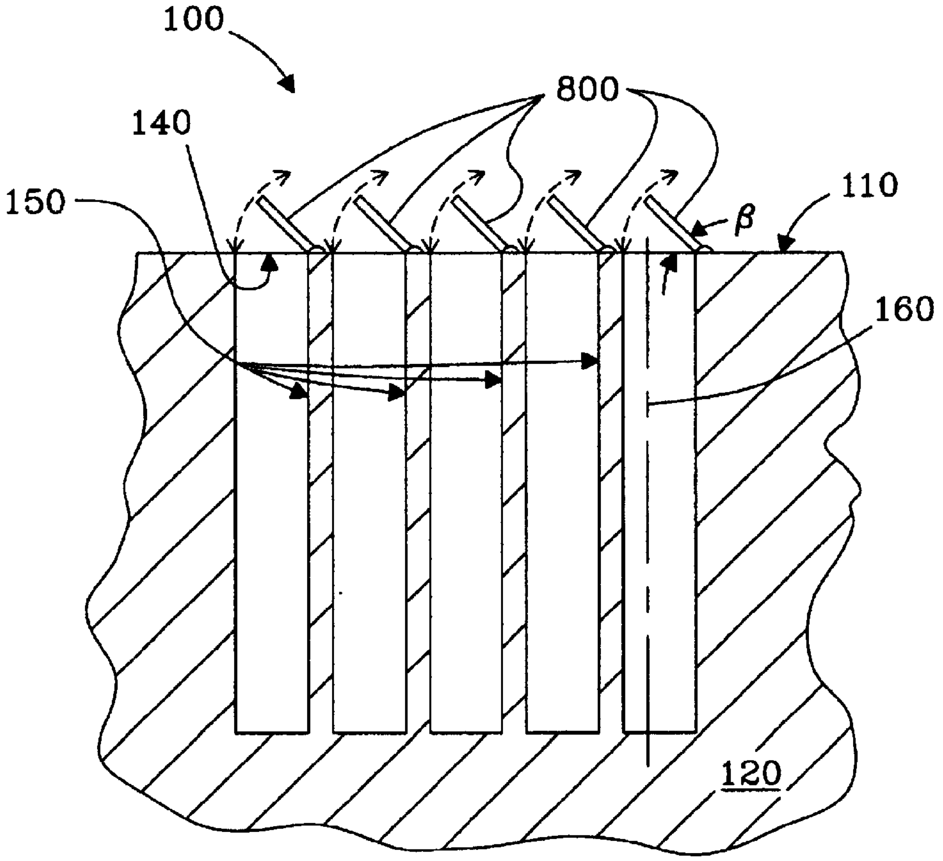
FIG. 8*a* illustrates another embodiment of the present invention whereby the degree of blackbody behavior (i.e., thermal emissivity) of the cavity structure is changed by changing the cavity area aspect ratio (i.e., by changing $A_a$) by the movement of caps over the cavity apertures.

FIG. 8*a* illustrates a further embodiment of the present invention whereby the size of the cavity apertures 140 is controlled by controlling the movement of caps 800 positioned proximate the cavity apertures 140. The caps 800 are attached (e.g., by fasteners, hinges, welding, soldering, adhesives, slide rails) to the radiative surface 110 to allow angular movement of the caps 800 through an angle β (up to 90° in this embodiment) relative to the radiative surface 110. In another embodiment, the movement of the caps 800 may be in the same plane as the radiative surface 110 (e.g., a cap 800 that slides across the radiative surface 110 along rails, not shown). The caps 800 may be moved relative to the radiative surface 110 individually, or in sets, by incorporating into the caps 800 active elements such as bimetallic, shape memory, piezoelectric, magnetic, magnetostrictive, and combinations thereof and then activating the caps 800 by the application of heat/cold, voltage, magnetic field, etc. Such activation causes the caps 800 to bend or otherwise move to change the size of the cavity apertures 140. The caps 800 may also be moved individually or in sets by mechanical means (e.g., a stepping motor). Furthermore, it is anticipated that an individual cap 800 may be sized such that it changes the size of more than one aperture 140 at one time upon its movement. In the embodiment shown in FIG. 8*a*, the cavity longitudinal axes 160 are approximately perpendicular to the plane of the cavity apertures 140, but the present invention is not limited to such an orientation.

Figure 8B:
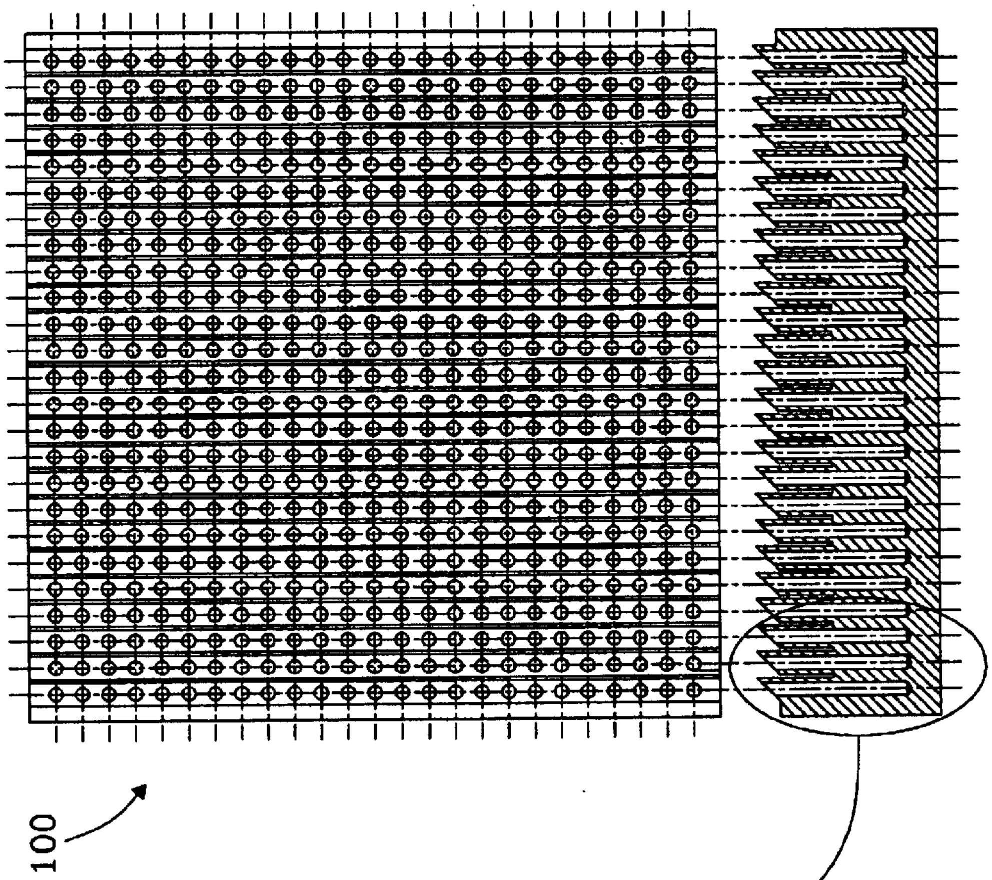
FIGS. 8*b*–8*c* illustrate another embodiment of the present invention, similar to that of FIG. 8*a*, whereby the caps and cavity structure are designed so as to produce thermal emissivity changes with less cap movement than that of the embodiment shown in FIG. 8*a;*
Figure 8C:
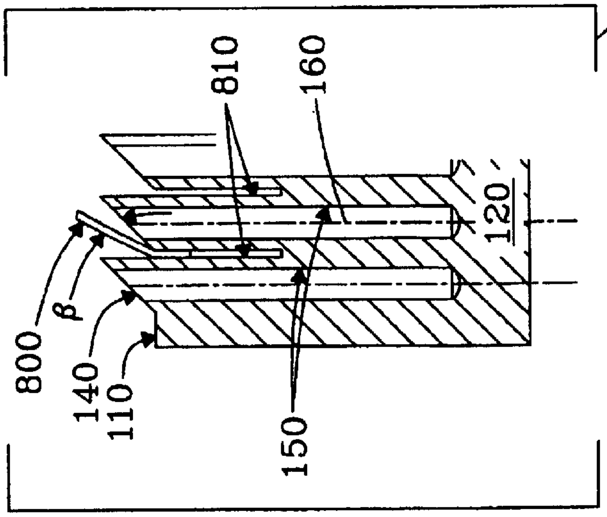

For example, FIGS. 8*b*–8*c* illustrate a further embodiment of the present invention, similar to that shown in FIG. 8*a*, except that the cavity longitudinal axis 160 is not perpendicular to the plane of the cavity apertures 140, and slots 810 are incorporated in the cavity structure 100. Such a cavity longitudinal axis 160 orientation reduces the amount of cap 800 angular movement (as indicated by the angle β) required for a given change in the size of the cavity aperture 140 (and thus, thermal emissivity). The slots 810 facilitate the attachment of the caps 800 to the cavity structure 100 (e.g., by using the slots 810 as a sliding track for the caps 800, or using the slots 810 as a means to press-fit or weld the caps 800 to the cavity structure 100).

Figure 9A:
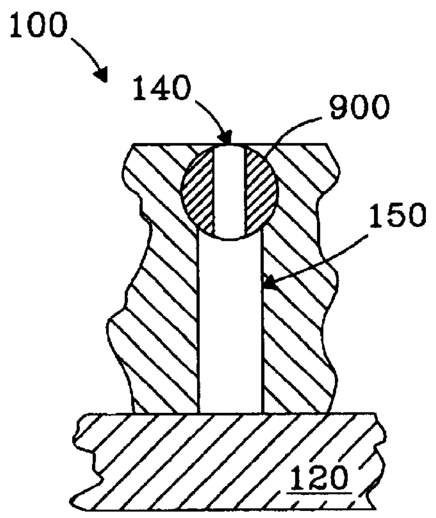
FIGS. 9*a*–9*b* illustrate another embodiment of the present invention whereby the degree of blackbody behavior (i.e., thermal emissivity) of the cavity structure is changed from high emissivity state (FIG. 9*a*) to a low emissivity state (FIG. 9*b*) by changing the cavity area aspect ratio (i.e., by changing $A_a$) by the rotation of a shutter.
Figure 9B:
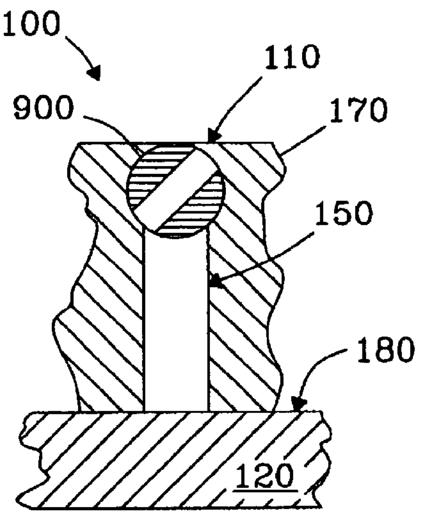

FIGS. 9*a*–9*b* show a further embodiment of the present invention whereby the size of the cavity aperture 140 is changed by the rotation of a shutter 900 located proximate to the cavity aperture 140 in a cavity article 170. The shutter 900 is penetrated by a hole such that by rotating the shutter 900 (e.g., by magnetic, electrical, pressure, or mechanical means), the effective size of the cavity aperture 140 is increased (FIG. 9*a*) or decreased (FIG. 9*b*). The hole in the shutter 900 can be any size or shape, depending upon the degree of radiative control desired.

Figure 10A:
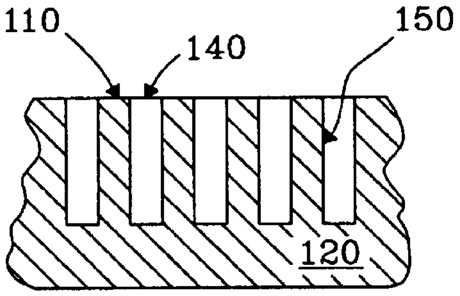
FIGS. 10*a*–10*b* illustrate another embodiment of the present invention whereby the degree of blackbody behavior (i.e., thermal emissivity) of the cavity structure is changed from a high emissivity state (FIG. 10*a*) to a low emissivity state (FIG. 10*b*) by changing the cavity area aspect ratio (i.e., by changing $A_a$) by the application of a shear force on the object.
Figure 10B:
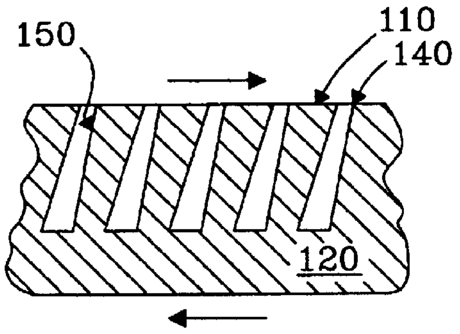
Figure 11A:
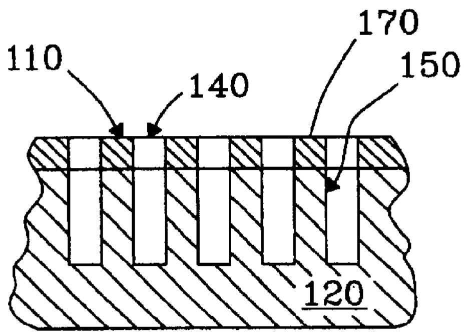
FIGS. 11*a*–11*b* illustrate another embodiment of the present invention whereby the degree of blackbody behavior (i.e., thermal emissivity) of the cavity structure is changed from a high emissivity state (FIG. 11*a*) to a low emissivity state (FIG. 11*b*) by changing the cavity area aspect ratio (i.e., by changing $A_a$) by the application of a shear force on a cavity article rigidly attached to the surface of the object.
Figure 11B:
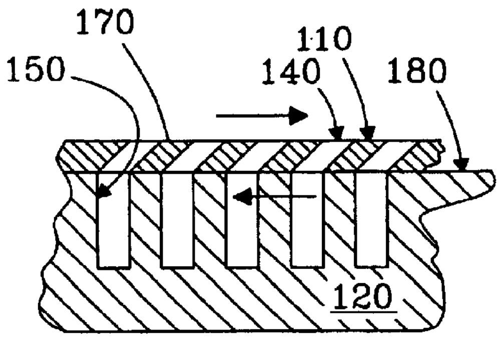

FIGS. 10*a*–10*b* show a further embodiment of the present invention whereby the size of the cavity aperture 140 is changed by mechanical deformation of the radiative surface 110 by shear force. FIGS. 11*a*–11*b* show a further embodiment of the present invention, similar to the embodiment shown in FIGS. 10*a*–10*b*, whereby the cavity surfaces 150 are shared between the cavity article 170 and the object 120. In this embodiment, the cavity article 170 would typically be rigidly fixed to the object surface 180. The cavity article 170 may be manufactured from a material different from that of the object 120 and which has desirable shear deformation properties.

Figure 12A:
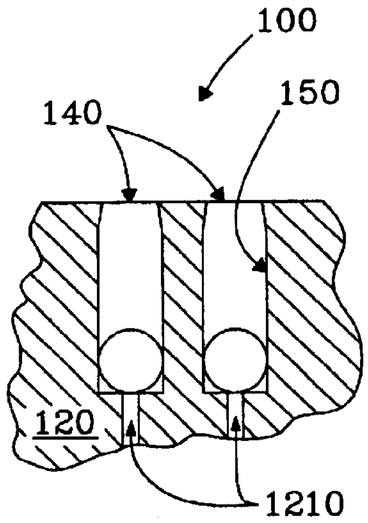
FIGS. 12*a*–12*b* illustrate another embodiment of the present invention whereby the degree of blackbody behavior (i.e., thermal emissivity) of the cavity structure is changed from a high emissivity state (FIG. 12*a*) to a low emissivity state (FIG. 12*b*) by changing the cavity area aspect ratio (i.e., by changing $A_c$) by the movement of a block within the cavity structure.
Figure 12B:
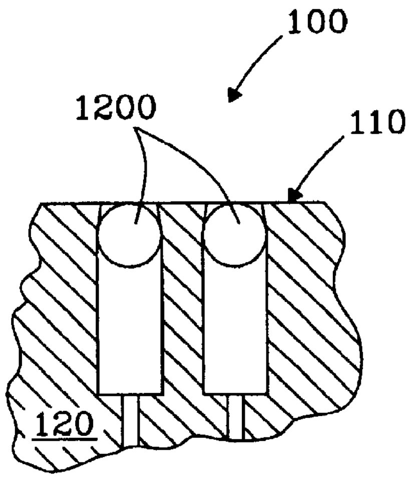

FIGS. 12*a*–12*b* illustrate a further embodiment of the present invention whereby the effective cavity surface area $A_c$ is changed by the movement of a block 1200 relative to the cavity surface 150. In this embodiment, if the shape of the cavity surface 150 is cylindrical, the block 1200 may be cylindrical or spherical in shape (similar configuration to that of a ball valve). The block 1200 may be moved by pressure differences across the block 1200 (e.g., by pneumatic or hydraulic means via channel 1210) or by magnetic, electrical, or mechanical means.

Figure 13A:
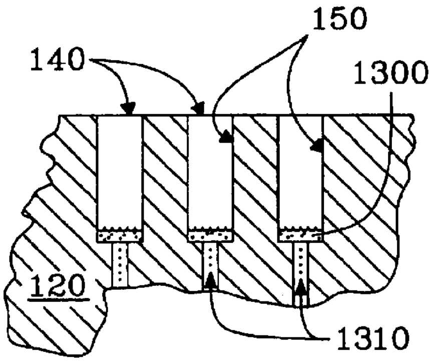
FIGS. 13*a*–13*b* illustrate another embodiment of the present invention whereby the degree of blackbody behavior (i.e., thermal emissivity) of the cavity structure is changed from a high emissivity state (FIG. 13*a*) to a low emissivity state (FIG. 13*b*) by changing the cavity area aspect ratio (i.e., by changing $A_c$) by the raising of the level of a selector within the cavity structure.
Figure 13B:
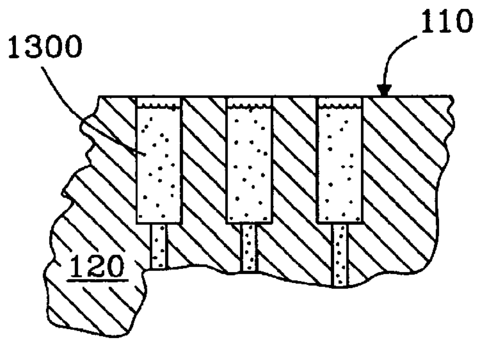

FIGS. 13*a*–13*b* illustrate a further embodiment of the present invention whereby the cavity structure 100 defines a plurality of cavities whereby one or more of the cavities are backfilled with a selector 1300. The selector 1300 may be a liquid, solid, condensable gas, or a combination thereof. In applications whereby the selector 1300 is fluid, the cavity surface area $A_c$ may be changed by the raising or lowering of the level of the selector 1300 using a feed/drain channel 1310. Furthermore, the cavity surface area $A_c$ may be changed by eliminating the feed/drain channel and relying on the evaporation, sublimation, or condensation of the selector 1300 to effect a change in the level of the selector 1300.

The thermal emissivity of a cavity structure 100 can further be changed or controlled by backfilling the cavities in the cavity structure 100 with a selector 1300 and then changing the radiative characteristics (e.g., reflectivity, transmissivity, and absorptivity) of the selector 1300 by the application of physical and/or environmental stimuli to the selector 1300. For example, the selector 1300 may be a luminescent material, liquid crystal, photochrome, electrochrome, or a combination thereof. Backfilling cavities with a selector 1300 that is reflective and/or opaque to incident radiation while transparent to emitted radiation or vice versa will have the character of a thermal diode. This is a further modification of the present invention that increases the ability to thermally engineer and independently control the radiative heat transfer properties of an object 120. This control approach can be designed to modify both emitted and absorbed radiation to effect thermal control of the object 120.

Activation of the selector 1300 by physical means and/or environmental stimuli provides a broad range of IR detection, recognition and tagging possibilities. For example, the cavity structure 100 of the present invention provides reservoirs for a variety of selectors 1300 to aid detection, inspection, tracking and tracing activities commonly practiced in law-enforcement, customs and excise, brand and fraud verification, etc. Selectors contained in cavity structures 100 having a high average cavity area aspect ratio will be superior to surface-applied taggants in resisting wear, erasure or alteration. Thermal or other means of activating the cavity structure 100 could dispense new selector 1300 to the radiative surface 110 to restore the desired IR signature of the surface and replace surface-active material that may have been removed or obscured.

Embodiments Whereby $\epsilon$ is Changed by Changing $\alpha$

Another embodiment of the present invention is a cavity structure 100 for an object 120 whereby the radiative heat transfer between the object 120 and its environment is controlled in situ by controlling the orientation of the cavity longitudinal axes 160 in the cavity structure 100 relative to the radiative surface 110. The controlling may be by passive means, active means, or combinations thereof (e.g., spontaneous or externally applied stimuli such as temperature, chemistry, biology, humidity, pressure, electrical current or field, voltage, magnetic field, electromagnetic radiation, particle radiation, mechanical force, and combinations thereof).

Figure 14A:
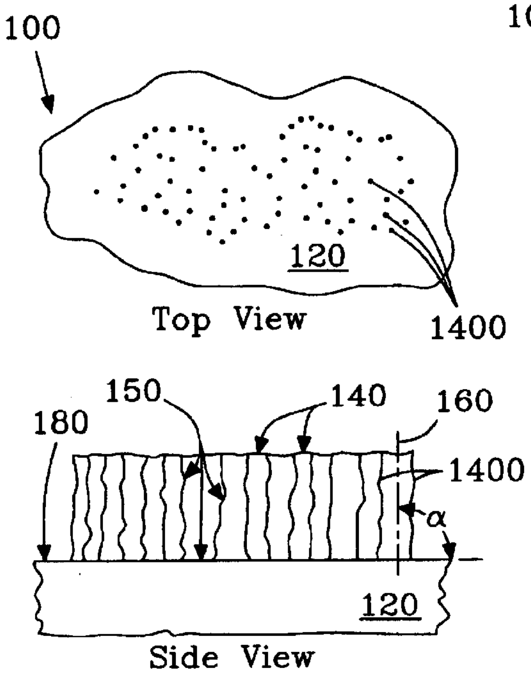
FIGS. 14*a*–14*b* illustrate another embodiment of the present invention whereby the cavity structure is a fiber mat and the degree of blackbody behavior (i.e., thermal emissivity) of the cavity structure is changed from a high emissivity state (FIG. 14*a*) to a low emissivity state (FIG. 14*b*) by changing the orientation of the cavity longitudinal axes.
Figure 14B:
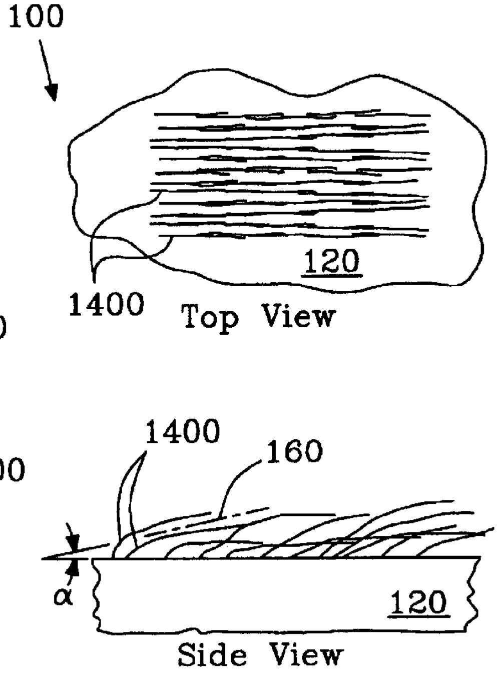
Figure 15:
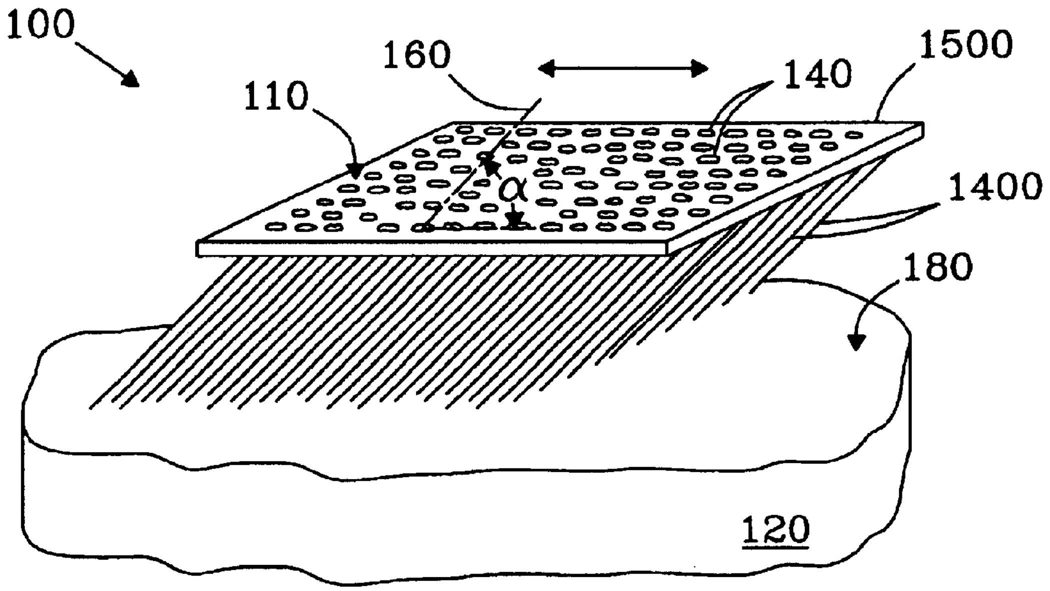
FIG. 15 illustrates another mode of changing the orientation of the cavity longitudinal axes of a cavity structure similar to that of FIGS. 14*a*–14*b*.

FIGS. 14–16 illustrate specific embodiments of the present invention whereby thermal emissivity control is obtained by varying the orientation of the cavity longitudinal axis 160 (measured by the angle $\alpha$). In these figures, the control systems and actuators are again not shown because it is evident to those skilled in the art that a variety of control systems and actuators could be utilized and interfaced with the cavity structure 100 without undue experimentation.

FIGS. 14*a*–14*b* illustrate a further embodiment of the present invention whereby the cavity structure 100 comprises a plurality of filaments 1400 whereby each end of a filament 1400 is attached to the object surface 180 to form a mat of filaments 1400 approximately parallel with one another. The mat may comprise, for example, 5–10 $\mu$m diameter filaments 1400 that are synthetic, ceramic, metal, or combinations thereof and typically would have a high surface reflectivity. The filaments 1400 may be solid or hollow and may be coated with a metal. For example, hollow filaments could be incorporated as micro heat pipes containing a working fluid. Such an arrangement would deploy in the high emissivity condition when the working fluid pressure reaches some design value as a consequence of heating. Such a cavity structure 100 has an array of interconnected cavity surfaces 150 and interconnected cavity apertures 140. The filaments 1400, oriented approximately perpendicular to the object surface 180 (i.e., $\alpha \cong 90°$), presents a maximum thermal emissivity configuration (FIG. 14*a*) while the filaments 1400 oriented approximately parallel to the object surface 180 (i.e., $\alpha \cong 0°$) presents a minimum thermal emissivity configuration (FIG. 14*b*). Maximum and minimum thermal emissivity configurations of the filaments 1400 may be obtained, for example, by applying a electrostatic charge to the filaments and grounding the filaments, respectively. An alternative embodiment of the present invention includes selective treating or coating of the filaments 1400 to obtain selective electrostatic behavior. Another means by which the orientation of the filaments 1400 may be changed is by attaching a substantial number of the free ends of the filaments 1400 to a perforated sheet 1500 as shown in FIG. 15 to form the cavity structure 100. As shown in FIG. 15, low and high thermal emissivity configurations may be obtained by translating the perforated sheet 1500 relative, and parallel, to the object surface 180. Relative movement between the perforated sheet 1500 and object 120 may be accomplished by a variety of means including, mechanical, thermal, electrical, magnetic, and chemical.

Figure 16A:
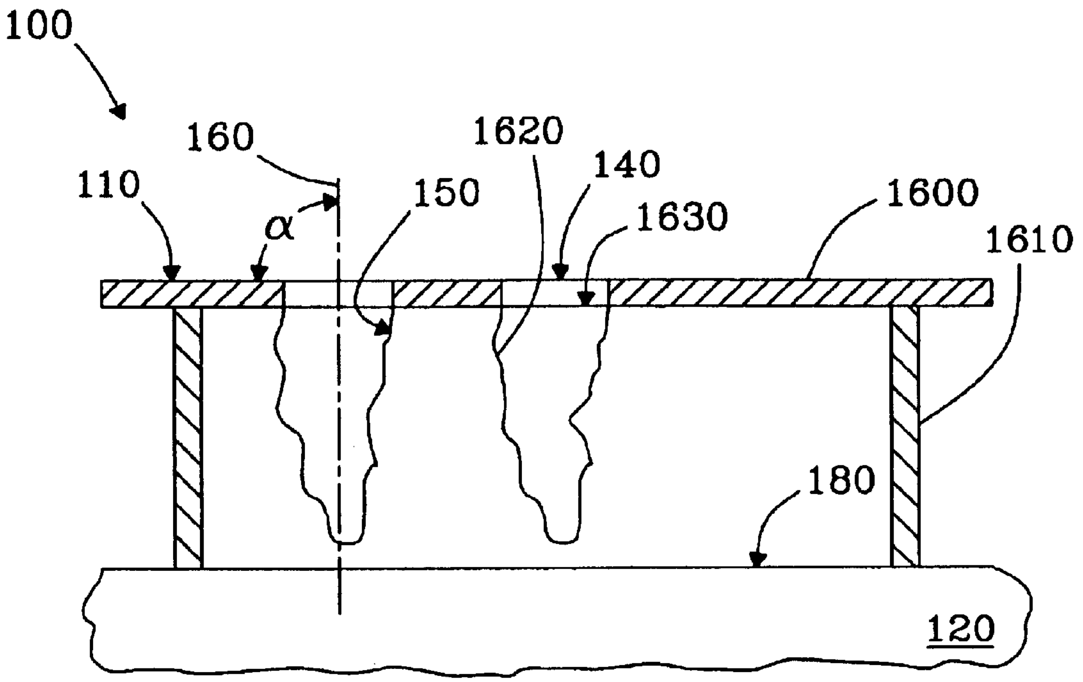
FIGS. 16*a*–16*b* illustrate another embodiment of the present invention whereby the cavity structure comprises bladders and the degree of blackbody behavior (i.e., thermal emissivity) of the cavity structure is changed from a high emissivity state (FIG. 16*a*) to a low emissivity state (FIG. 16*b*) by changing the orientation of the cavity longitudinal axes.
Figure 16B:
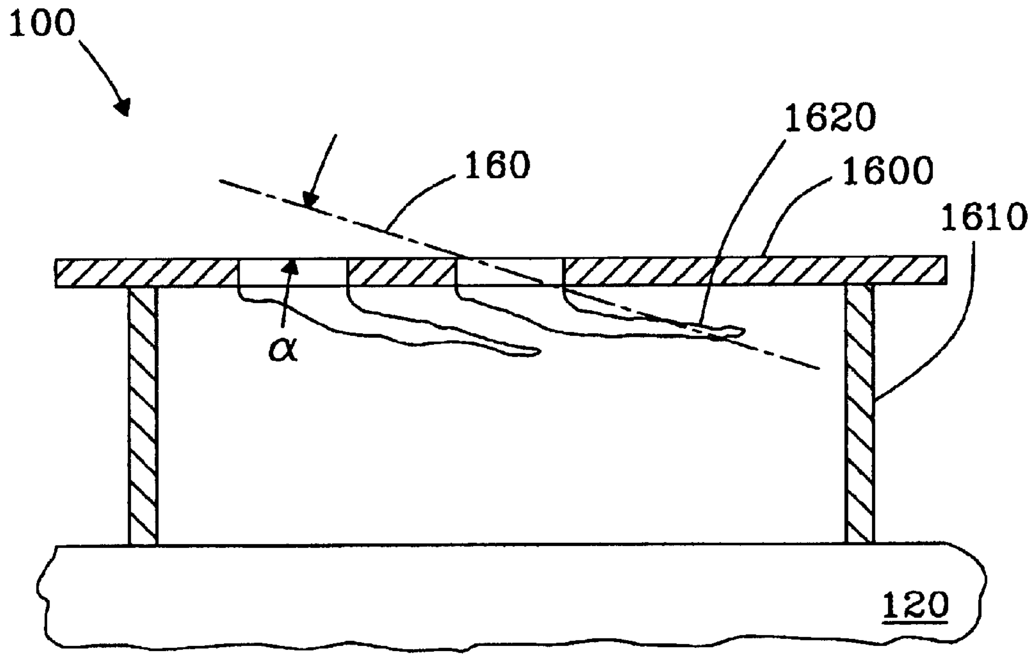

FIGS. 16*a*–16*b* illustrate a further embodiment of the present invention whereby the cavity structure 100 comprises a perforated membrane 1600 defining a plurality of cavity apertures 140. The perforated membrane 1600 may be a perforated plate/sheet, mesh, or screen. The perforated membrane 1600 is typically thermally bonded to the object 120 by one or more connecting members 1610. The cavity structure 100 further comprises a plurality of inflatable and/or deflatable bladders 1620 that have an open end 1630 attached to the perforated membrane 1600 at the cavity aperture 140. As shown in FIGS. 16*a*–16*b*, high and low thermal emissivity configurations may be obtained by inflating or deflating the bladder 1620, effectively changing the orientation of the cavity longitudinal axis 160 relative to the radiative surface 110. Such inflation/deflation may be accomplished by such means as mechanical suction, pressurization through heating, and mechanical expansion.

As is evident from the foregoing, another embodiment of the present invention is a cavity structure 100 for an object 120 whereby the radiative heat transfer between the object 120 and its environment is controlled in situ by controlling the cavity area aspect ratio R and orientation of the cavity longitudinal axis 160 in combination.

The present invention has extremely broad and diverse applications with the potential of providing preset or dynamic control of temperature and heat transfer in objects as diverse as automobiles, machinery, buildings, power generation equipment, and military and space systems. Cavity structures 100 used in the manner disclosed herein enable a variety of components (e.g., engines, exhaust components, transmission lines, reactors) to run cooler, thereby reducing the size and power requirements of the conventional cooling system, increasing safety, and extending component life. Furthermore, the cavities in the cavity structures 100 can be backfilled with a material (e.g., glass, polymer), that is substantially transparent to the incident and emitted radiation, to restore the original surface smoothness and prevent the cavities from being filled with dirt or other undesirable materials.

The present invention also offers the potential of controlling the sizes of individual, or groups, of cavity apertures 140, cavity surfaces 150, or combinations thereof, to effect local control of thermal zones on an object 120. Among many possible uses, the ability to program individual or groups of cavity apertures 140, cavity surfaces 150, or combinations thereof, with a different thermal emissivity could be used to disguise or randomize the IR signature of objects 120 so that they escape detection by IR cameras or sensors. Such an arrangement could provide thermal camouflage of objects 120 having, for example, military or law-enforcement significance. Furthermore, actively controlled cavity structures 100 could enable a programmable identification friend or foe (IFF) capability necessary in warfare and law-enforcement. IFF signatures expressed by patterns of open and closed cavity apertures 140 would be detectable by IR cameras or sensors. These patterns could be reprogrammed frequently to avoid recognition or use by an enemy. Another application is maintaining optical precision in relatively large structures such as telescopes. With computer control of a cavity structure 100 in the base of a large mirror system, for example, thermal emissivity could be manipulated to provide a means of ultrafine-tuning the mirror's shape by local thermally-induced contractions and expansions of the structure.

CLOSURE

While numerous embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A method of increasing the thermal emissivity of a surface of an object comprising the step of:

forming a cavity structure on the surface defining a plurality of cavities, said cavity structure further defining a plurality of cavity apertures and cavity surfaces, wherein said cavity structure has an average cavity area aspect ratio of at least 8.

2. The method of claim 1, wherein said forming comprises selectively removing material from the surface of the object.

3. The method of claim 1, wherein said forming comprises selectively adding material to the surface of the object.

4. The method of claim 1, wherein the ratio of the cumulative cross-sectional area of said plurality of cavity apertures to surface area that is not occupied by said plurality of cavity apertures is greater than about 1:4.

5. The method of claim 4, wherein the ratio of the cumulative cross-sectional area of said plurality of cavity apertures to surface area that is not occupied by said plurality of cavity apertures is greater than about 2:1.

6. The method of claim 1, wherein said plurality of cavity apertures form a geometric array on the surface of the object.

7. The method of claim 1, wherein said plurality of cavity apertures are circular in shape.

8. The method of claim 7, wherein said plurality of cavity apertures have approximately the same diameter.

9. The method of claim 1, wherein the average effective diameter of said plurality of cavity apertures is at least 10 μm.

10. The method of claim 1, further comprising the step of backfilling at least a portion of said plurality of cavities in said cavity structure with a material that is substantially transparent to incident and emitted radiation.

11. A method of controlling the amount of radiation transferred between a surface of an object and its environment in situ, comprising the steps of:

forming a cavity structure on the surface defining a plurality of cavities, said cavity structure further defining a plurality of cavity apertures and cavity surfaces, wherein said cavity structure has an average cavity area aspect ratio of at least 8; and changing the degree of blackbody behavior of the surface by changing a physical characteristic of said cavity structure in situ.

12. The method of claim 11, wherein said physical characteristic is selected from the group consisting of cavity area aspect ratio, cavity longitudinal axis orientation, and combinations thereof.

13. The method of claim 12, wherein changing the cavity area aspect ratio is by changing the area of at least a portion of said plurality of cavity apertures.

14. The method of claim 13, wherein changing the area of at least a portion of said plurality of cavity apertures is by moving at least one cap proximate said portion of cavity apertures.

15. The method of claim 14, wherein said at least one cap incorporates an activate element selected from the group consisting of bimetallic, shape memory, piezoelectric, magnetic, magnetostrictive, and combinations thereof.

16. The method of claim 13, wherein changing the area of at least a portion of said plurality of cavity apertures is by deforming said portion of cavity apertures.

17. The method of claim 12, wherein changing the cavity area aspect ratio is by changing the area of at least a portion of said plurality of cavity surfaces.

18. The method of claim 17, wherein changing the area of at least a portion of said plurality of cavity surfaces is by changing the level of a selector contained in said portion of said plurality of cavities.

19. The method of claim 11, further comprising the step of backfilling at least a portion of said plurality of cavities in said cavity structure with a selector, wherein said selector is selected from the group consisting of luminescent materials, liquid crystals, photochromes, electrochromes, and combinations thereof.

20. The method of claim 11, wherein changing said physical characteristic is caused by a stimulus selected from the group consisting of temperature, chemistry, biology, humidity, pressure, electrical current, electric field, voltage, magnetic field, electromagnetic radiation, particle radiation, mechanical force, and combinations thereof.

21. The method of claim 11, wherein the average effective diameter of said plurality of cavity apertures is at least 10 μm.

22. A surface structure that increases the thermal emissivity of a surface of an object, comprising:

a cavity structure defining a plurality of cavities, said cavity structure further defining a plurality of cavity apertures and cavity surfaces, wherein said cavity structure has an average cavity area aspect ratio of at least 8.

23. The surface structure of claim 22, wherein the ratio of the cumulative cross-sectional area of said plurality of cavity apertures to surface area that is not occupied by said plurality of cavity apertures is greater than about 1:4.

24. The surface structure of claim 23, wherein the ratio of the cumulative cross-sectional area of said plurality of cavity apertures to surface area that is not occupied by said plurality of cavity apertures is greater than about 2:1.

25. The surface structure of claim 22, wherein said plurality of cavity apertures form a geometric array on the surface.

26. The surface structure of claim 22, wherein said plurality of cavity apertures are circular in shape.

27. The surface structure of claim 26, wherein said plurality of cavity apertures have approximately the same diameter.

28. The surface structure of claim 22, wherein the average effective diameter of said plurality of cavity apertures is at least 10 μm.

29. The surface structure of claim 22, further comprising a material that backfills at least a portion of said plurality of cavities in said cavity structure, said material substantially transparent to incident and emitted radiation.

30. A controllable surface structure for controlling the amount of radiation transferred between a surface of an object and its environment in situ, comprising:

a cavity structure defining a plurality of cavities, said cavity structure further defining a plurality of cavity apertures and cavity surfaces, wherein said cavity structure has an average cavity area aspect ratio of at least 8; and a means to change a physical characteristic of said cavity structure in situ to control the degree of blackbody behavior of the surface.

31. The controllable surface structure of claim 30, wherein said physical characteristic is selected from the group consisting of cavity area aspect ratio, cavity longitudinal axis orientation, and combinations thereof.

32. The controllable surface structure of claim 30, wherein said means is selected from the group consisting of electrical, mechanical, and combinations thereof.

33. The controllable surface structure of claim 30, wherein the average effective diameter of said plurality of cavity apertures is at least 10 μm.

34. The controllable surface structure of claim 30, further comprising a selector in at least a portion of said plurality of cavities.

35. The controllable surface structure of claim 34, wherein said selector is selected from the group consisting of luminescent materials, liquid crystals, photochromes, electrochromes, and combinations thereof.

* * * * *